United States Patent [19]

Hoshino et al.

[11] 4,290,008
[45] Sep. 15, 1981

[54] METHOD AND APPARATUS FOR DISCRIMINATIVELY DETERMINING ELECTRICAL CONSTANTS

[75] Inventors: Yoshikazu Hoshino, Kusatsu; Masayoshi Shuto, Suita, both of Japan

[73] Assignee: Shionogi & Co., Ltd., Osaka, Japan

[21] Appl. No.: 22,835

[22] Filed: Mar. 22, 1979

[30] Foreign Application Priority Data

Apr. 5, 1978 [JP] Japan .................................. 53/40733

[51] Int. Cl.³ ...................... G01R 27/26; G01R 27/02
[52] U.S. Cl. .................................. 324/57 R; 324/59; 324/61 R; 324/65 R
[58] Field of Search ................. 324/57 R, 61 R, 60 R, 324/60 CD, 59, 62, 65 R

[56] References Cited

U.S. PATENT DOCUMENTS 3,970,925  7/1976  Procter et al. .................... 324/60 R Primary Examiner—Ernest F. Karlsen
Attorney, Agent, or Firm—Cushman, Darby & Cushman

[57] ABSTRACT

An apparatus and method for determining electrical characteristics of an object wherein the phase difference between an input signal to and an output signal from a measuring circuit containing the object is maintained constant. Properties of the object are determined by monitoring the output of the measuring circuit of an amplitude signal related to the resistance of the object and by monitoring the output of the measuring circuit for an amplitude signal and a frequency signal related to the reactive impedance of the object.

20 Claims, 10 Drawing Figures

METHOD AND APPARATUS FOR DISCRIMINATIVELY DETERMINING ELECTRICAL CONSTANTS

BACKGROUND OF THE INVENTION

1. Field of the Invention

The present invention relates to the method and the apparatus for discriminatively determining various electrical constants, that is, capacitance, inductance, and resistance or its reciprocal of an object to be measured.

2. Explanation of the Prior Art

Since, from the point of view of equivalent circuit, any capacitance or inductive element necessarily contains a resistive part, when the capacitance or the inductance of those elements is measured, particularly when any continuous measurement of their variation is necessary, it is very difficult to exclude errors, that is, deviations from the true value due to their equivalent resistance part included.

Particularly in the case that these values are measured in a material-constant measuring system such as in a continuous monitoring system for a liquid material flowing through a detection cell, it is desired to be capable of measuring the capacitance, inductance, and the resistance or its reciprocal discriminatively as well as simultaneously. However, heretofore neither apparatus nor method which can respond sufficiently to those desires has yet been proposed.

SUMMARY OF THE INVENTION

The present invention provides a method and apparatus to discirminatively determine electrical constants.

DETAILED EXPLANATION OF THE PREFERRED EMBODIMENT

The gist of the method in accordance with a representative embodiment of the present invention is as follows:

(1) The phase angle in the frequency transfer function of a measuring unit circuit which contains an object to be measured is maintained to a constant preset value.

(2) For the purpose of this maintenance of the phase angle, a means detecting the phase difference between the input signal to said measuring unit circuit and the output signal therefrom is provided, and a variable frequency oscillator (voltage controlled) which is controlled by the resultant phase difference signal is placed in front of the measuring unit circuit, then with these structural elements a constant-value control loop is composed.

(3) From this constant-value control loop the output signal of the measuring unit circuit is taken out, and then a resultant DC signal is utilized, after a differential amplification if necessary, as the signal for the resistance value or its reciprocal.

(4) In the above case, it is also possible to obtain the signal for the resistance value or its reciprocal by detecting either the period or the frequency of the output of a voltage-to-frequency (or voltage-to-period) converter which is controlled by the abovementioned DC signal.

(5) The abovementioned frequency signal is counted by a counter whose gate is controlled by the output signal from said variable frequency oscillator or by a signal of frequency of submultiple of the above frequency. The resultant count signal is further utilized as the capacitance or inductance part signal through a digital to analogue converter if necessary.

(6) In the above case, since only the period itself is the necessary signal component for the gate-controlling signal to the counter, the output signal from the measuring unit circuit can also be utilized for the gate control.

In the following, detailed explanations to more detailed configurations of the preferred embodiment in accordance with the present invention will be given referring to the attached drawings.

Figure 1:
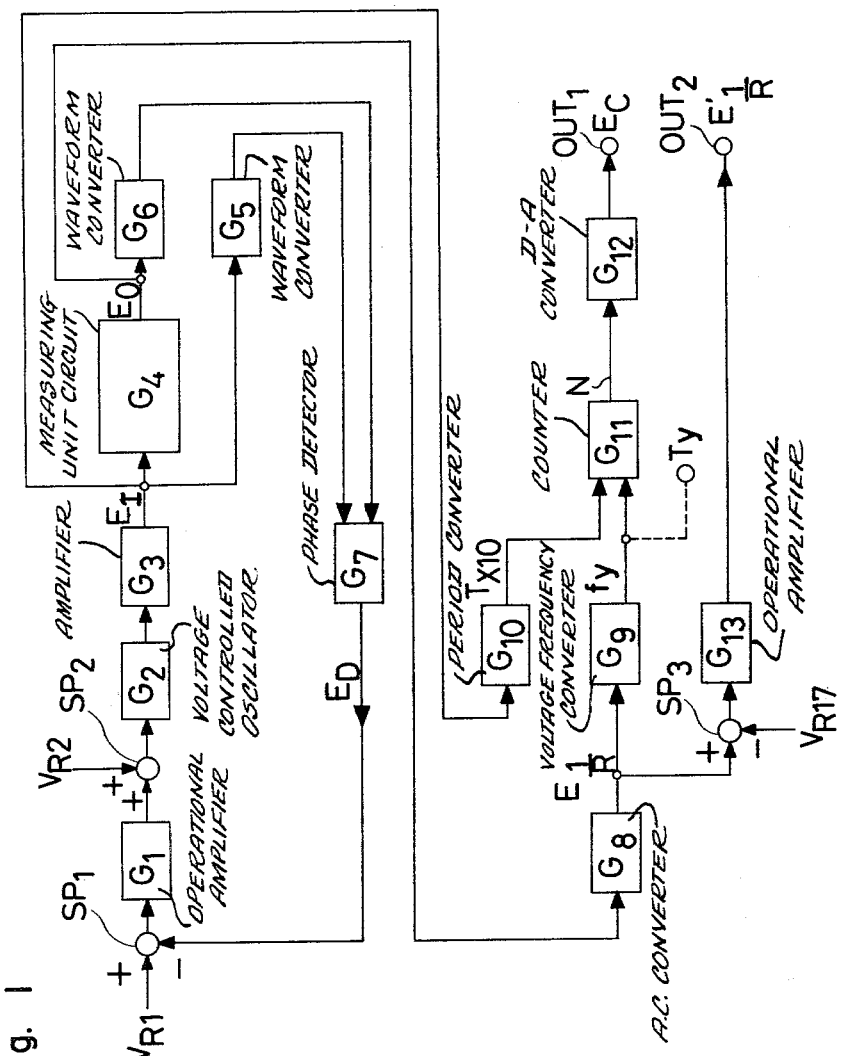
FIG. 1 is a block diagram which explains the principle of the present invention.

FIG. 1 is a block diagram showing the outline of principle of the present invention, wherein $G_4$ is a part comprising an object to be measured and a circuit part relating thereto. Let us call this part $G_4$ the "measuring unit circuit". The object to be measured can be expressed with an equivalent circuit which generally includes resistive, capacitive and inductive elements. Then the measuring unit circuit is normally classified into several types according to the kind of their component elements of the object to be measured and the relating circuit part. Since all types, in principle, can be treated with a common procedure, the detailed explanation is given here only for a specific example wherein an equivalent circuit of an object to be measured consists of a parallel connection of a resistor and a capacitor. Examples of other types will be described later.

In FIG. 1, $G_2$ is a voltage controlled oscillator which feeds sinusoidal output voltage to the measuring unit circuit $G_4$ through a current amplifier $G_3$. Then an input voltage $E_I$ and an output voltage $E_o$ of the measuring unit circuit $G_4$ are both sinusoidal in the steady-state. Both of these sinusoidal waves are transformed into rectangular waves by waveform converters $G_5$ and $G_6$, then these rectangular waves are applied to a phase detector $G_7$. A DC voltage proportional to the phase difference between the input sinusoidal voltage $E_I$ and the output sinusoidal voltage $E_o$ is obtained as its output. This DC voltage is compared with a reference voltage $V_{R1}$ by a summing point $SP_1$ and its resultant difference is amplified by a differential operational amplifier $G_1$.

The voltage controlled oscillator $G_2$ which is biased by a bias voltage $V_{R2}$ fed through a summing point $SP_2$ is controlled by the output voltage of the operational amplifier $G_1$ in a manner that its oscillation frequency is changed so as to suppress the variation of the phase difference between the voltage and the current of the measuring unit circuit $G_4$. Consequently this phase difference is always kept at a constant preset value. In this sense, this control scheme is categorized as the constant-value control.

In the following, first, only the functional process of the present apparatus is described and after that the detailed operation principle is explained. Under the state previously described, the sinusoidal output voltage Eo of the measuring unit circuit $G_4$ is transformed into a DC voltage $E_{1/R}$ by an AC-DC converter $G_8$. The difference between this DC voltage $E_{1/R}$ and a zero-setting voltage $V_{R17}$ is applied by a summing point $SP_3$ to an operational amplifier $G_{13}$, then in this case its output voltage is issued as a conductance part signal voltage $E'_{1/R}$ which is proportional to the conductance part of the object to be measured. Said output DC voltage $E_{1/R}$ of the AC-DC converter $G_8$ is fed into a voltage-to-frequency converter $G_9$. Hereupon, if a signal proportional to the resistance value itself is also desired, which is inversely proportional to the conductance value, a period $T_y$ (shown in the diagram or available at a terminal of a dotted line) of the output sinusoidal signal of the voltage-to-frequency converter $G_9$ can be utilized, since $T_y$ is inversely proportional to $E_{1/R}$. The output of said voltage-to-frequency converter $G_9$ is fed into a counter $G_{11}$ for counting its frequency $f_y$. Meanwhile, the period of the output sinusoidal wave of $G_3$, that is, the period of the input sinusoidal voltage $E_I$ to the measuring unit circuit $G_4$, is utilized to generate a gate open time $T_{x10}$ for the counter $G_{11}$ through a period converter $G_{10}$. As the result of this $G_{11}$ works as not only a usual counter, but also performs arithmetic processing, i.e., multiplication, that its output count N becomes independent from a resistance part of the object to be measured and proportional only to a capacitance part of it, as will be shown by Eq. (13-3). This output count N is then converted into an analogue output quantity through a D-A converter $G_{12}$ and is issued as a capacitance part signal voltage Eo.

Next, the theoretical explanation to the operation principle of the apparatus having above-described circuit construction is given in the following.

Figure 2A:
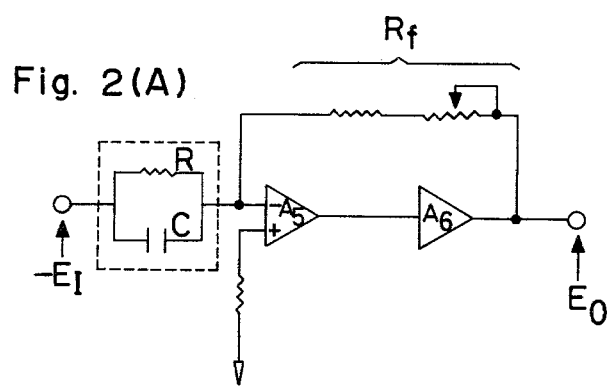
FIG. 2 shows circuit diagrams of various circuit constructions A, B, C and D of the measuring unit circuit.

(1) Circuit construction of the measuring unit circuit $G_4$:

A circuit construction of the measuring unit circuit including an object to be measured which is expressed by an equivalent circuit of a parallel connection of a capacitance C and a resistance R is such as shown in FIG. 2A.

Here, a part surrounded by a dotted line is the object to be measured. First the values of R, C and an input voltage $E_I$ are assumed to be those in the steady-state. In this case $E_I$ is written as $$E_I = |E_I| e^{j\omega_x t},$$

where $|E_I|$ is the amplitude and $\omega_x$ is the angular frequency of the input voltage, respectively. Also, amplifiers $A_5$ and $A_6$ are assumed to be ideal ones, that is, the following conditions
Input impedance = ∞
Open loop gain = ∞
Phase rotation = 0
are assumed. Then, let us define a transfer function $K_4$ of the measuring unit circuit $G_4$ as:

$$K_4 = Eo/-E_I = (1/R + j\omega_x C) R_f \qquad (1),$$

where Eo is an output voltage and $R_f$ is a feedback resistance. Since the phase-angle between the input and the output voltages of $G_4$ is given by $$\theta = \tan^{-1} \omega_x \cdot C \cdot R \qquad (2).$$

If this phase angle can be kept constant, then the following relation $$C \propto 1/\omega_x \cdot 1/R \qquad (3)$$

is established. Therefore, it is understood that, by measuring $1/R$ and $1/\omega_x$ and taking their mutual product, a value of C can be obtained therefrom.

(2) Prerequisite condition of the constant-value control:

The partial differential coefficients of the phase angle $\theta$ expressed by Eq. (2) with respect to $\omega_x$, C, and R are given, respectively by $$K_{\omega_x} = \frac{\partial \theta}{\partial \omega_x} = \frac{C \cdot R}{1 + (\omega_x \cdot C \cdot R)^2}, \qquad (4)$$

$$K_C = \frac{\partial \theta}{\partial C} = \frac{\omega_x \cdot R}{1 + (\omega_x \cdot C \cdot R)^2}, \qquad (5)$$

$$K_R = \frac{\partial \theta}{\partial R} = \frac{\omega_x \cdot C}{1 + (\omega_x \cdot C \cdot R)^2}. \qquad (6)$$

Since the total differential $d\theta$ of the phase angle $\theta$ is defined as $$d\theta = K_{\omega_x} \cdot d\omega_x + K_C \cdot dC + K_R \cdot dR$$

the increment $\Delta\theta$ of $\theta$ is written as follows by using the increments $\Delta\omega_x$, $\Delta C$ and $\Delta R$ of $\omega_x$, C and R, respectively:

$$\Delta\theta \approx K_{\omega_x} \cdot \Delta\omega_x + K_C \cdot \Delta C + K_R \cdot \Delta R.$$

Then, under the condition of the steady-state, those partial differential coefficients $K_{107x}$, $K_C$, and $K_R$ given in Eqs. (4), (5) and (6) can be treated similarly as for the transfer functions.

When no integration unit circuit is included in the composing unit circuits of the circuit shown in FIG. 1, time constants of those unit circuits are very small and dead times of them are also very short ones, and moreover since the time variation of the signal is very slow, all the included unit circuits can be regarded to be of zero order.

Therefore, transfer functions of all the included unit circuits Gn (n=1, . . . , 13, except n=4) can be expressed as real constants Kn (n=1, . . . , 13, except n=4), and under this assumption the following explanation is given.

Figure 3:
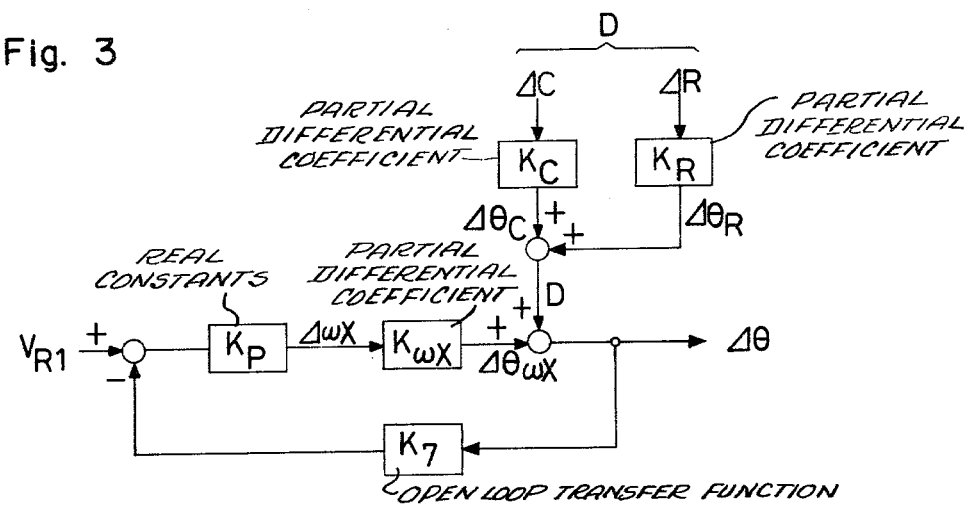
FIG. 3 is a functional block diagram of a constant-value control loop.

(3) Constant-value control of the phase angle $\theta$:

A functional block diagram of the constant value control loop of FIG. 1, on which the present invention is based, is shown in FIG. 3. Here, $V_{R1}$ is the command of the control, that is, the phase angle setting voltage, and $\theta$ is the controlled variable. Kp inclusively represents $K_1$, $K_2$, and $K_3$, and $K_{\omega_x}$, $K_C$, and $K_R$ are those defined in the above Eqs. (4), (5) and (6), respectively.

The control system of FIG. 3 can be expressed by the following equation:

$$(V_{R1} - K_7 \cdot \Delta\theta) K_p \cdot K_{\omega_x} + \{(K_C \cdot \Delta C + K_R \cdot \Delta R)\} = \Delta\theta \qquad (7).$$

Here, if the second parenthesis term of the left hand side of Eq. (7) may be regarded as the disturbance in a control loop, then letting this term be a disturbance D (D = $K_C \cdot \Delta C + K_R \cdot \Delta R = \Delta\theta_C + \Delta\theta_R$), and also setting the command $V_{R1}$ to zero for simplicity of the explanation, then from the above Eq. (7), $\Delta\theta$ in this case is given as $$\Delta\theta = 1/(1 + K_P \cdot K\omega_x \cdot K_{17}) \cdot D.$$

Hereupon, since $K_P \cdot K\omega_x \cdot K_7$ means the open-loop transfer function F, then $\Delta\theta$ may be written as $$\Delta\theta = 1/(1+F) \cdot D \tag{8}.$$

Thus for a very large value of F, $$\Delta\theta \approx 0 \tag{8'}.$$

Moreover, if at least a single integration unit circuit is added to the loop for increasing the stability of the loop, it is possible to make the steady-state residual offset $\Delta\theta_{ss}$ of $\Delta\theta$ to be zero. Since the addition of the integration unit circuit is a conventional measure in the control loop, the integrator unit circuit is omitted for the sake of simplicity.

Figure 4:
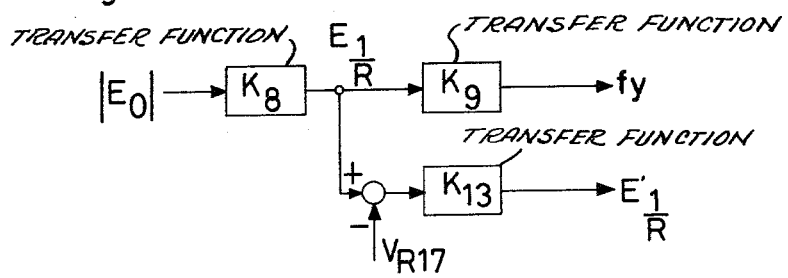
FIGS. 4 to 6 are functional block diagrams of signal transfers and an arithmetic operations.

(4) Signal conversion and arithmetic processing system:

(i) The output frequency $f_y$ of the voltage-to-frequency converter $G_9$ and the output of the AC-DC converter $G_8$, that is, the conductance part signal $E'_{1/R}$:

A functional block diagram of only this part in the whole circuit of FIG. 1 is shown in FIG. 4, and its function is expressed by the following equation;

$$E_{1/R} = K_8 \cdot |Eo| \tag{9-1}$$

where $|Eo|$ is the amplitude of the output of $G_4$.

Here, if the value of $V_{R17}$ is taken to be $V_{R17}=0$, then the conductance signal $E'_{1/R}$ becomes $$E'_{1/R} = K_8 \cdot K_{13} \cdot |Eo| \tag{9-2},$$

and the output frequency $f_y$ of $G_9$ is given by $$f_y = K_9 \cdot E_{1/R} \tag{9-3}$$

Figure 5:
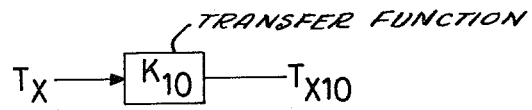

(ii) The output of the period converter $G_{10}$, that is, the gate open time $T_{x10}$:

Only the relevant part of the whole circuit of FIG. 1 is shown in FIG. 5, and its function is expressed by the following equation;

$$T_{x10} = K_{10} \cdot T_x \tag{10},$$

where $T_x$ is a period of the output sinusiodal wave of the voltage controlled oscillator $G_2$.

Figure 6:
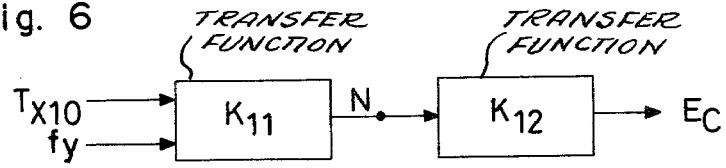

(iii) The capacitance part signal voltage Ec:

Similarly as in the preceding items, this part is shown in FIG. 6 and its function is expressed by $$N = f_y \cdot T_{x10} \tag{11-1}$$

where N is the count by the counter $G_{11}$ of output pulses of $G_9$ in a time interval of said gate open time $T_{x10}$. In this case, the function of $G_{11}$ is that of a multiplier whose input signals are a frequency and a time interval as expressed by Eq.(11-1).

Therefore, the output of the D-A converter $G_{12}$, that is, the capacitance part signal voltage $E_C$ is given by $$Ec = K_{12} \cdot N \tag{11-2}.$$

(5) Relation between the measured quantity and the output signal of the apparatus:

(i) Relation between the conductance 1/R and its output signal $E'_{1/R}$:

The amplitude $|Eo|$ of the output voltage Eo of the measuring unit circuit $G_4$ can be expressed as $$|Eo| = |K_4 \cdot (-E_I)| \tag{12-1}$$

$$= \left| \left( \frac{1}{R} + j\omega_x C \right) \cdot R_f \cdot (-|E_I|e^{j\omega xt}) \right|$$

$$= R_f \cdot |E_I| \cdot \sqrt{1 + (\omega_x R \cdot C)^2} \cdot \frac{1}{R}.$$

Substitution of $|Eo|$ given by the above equation into Eq. (9-2) yields $$E'_{\frac{1}{R}} = K_8 \cdot K_{13} \cdot R_f \cdot |E_I| \sqrt{1 + (\omega_x R \cdot C)^2} \cdot \frac{1}{R}, \tag{12-2}$$

and since $\theta = \tan^{-1}\omega_x C \cdot R$, that is since $\sqrt{1+(\omega_x R \cdot C)^2} = \sec\theta$, from Eq. (2), then Eq. (12-2) becomes $$E'_{1/R} = K_8 \cdot K_{13} \cdot R_f |E_I| \sec\theta \cdot 1/R \tag{12-3}$$

Here letting $\kappa_{1/R} = K_8 \cdot K_{13}$, then $$E'_{1/R} = \kappa_{1/R} \cdot R_f E_I \sec\theta \cdot 1/R \tag{12-4}.$$

Letting $\theta_o$ be a phase angle at the balance state of the constant value control loop, that is, at the time when the controlled quantity becomes equal to its command and hence the offset becomes zero, the phase angle can be written in general as $$\theta = \theta_o + \Delta\theta.$$

Under the condition of a large value of open loop transfer function F, $\Delta\theta \approx 0$ holds as in Eq. (8)', therefore Eq. (12-4) becomes $$E'_{1/R} = \kappa_{1/R} \cdot R_f |E_I| \cdot \sec\theta_o \cdot 1/R \tag{12-5}.$$

Then, it is understood from this equation that for an appropriately given fixed value of the feed back resistance $R_f$ the conductance part output signal voltage $E'_{1/R}$ can be kept approximately proportional to the conductance 1/R provided that the amplitude of the input voltage $E_I$ to the measuring unit circuit is kept constant.

Practically the measuring control loop expressed with the approximate equality equation (12-5) can be applied for most cases, but it also a conventional measure to stabilize the loop by adding more than one integration unit circuit, and in this case the steady-state offset $\Delta\theta_{ss}$ becomes zero and hence Eq. (12-5) holds exactly.

(ii) Relation between the capacitance C and its output signal Ec:

Starting from Eq. (11-2), it can be shown that Ec is proportional only to C. The explanation thereto is given in the following. First substitution of Eq. (11-1) into Eq. (11-2) yields $$Ec = K_{12} \cdot f_y \cdot T_{y10},$$

then with Eq. (10)

$$Ec = K_{12} \cdot f_y \cdot K_{10} \cdot T_x,$$

also with Eq. (9-3)

$$Ec = K_{12} \cdot K_9 \cdot E_{1/R} \cdot K_{10} \cdot T_x,$$

further this can also be rewritten by Eq. (9-1) as $$Ec = K_{12} \cdot K_9 \cdot K_8 \cdot |E_o| \cdot K_{10} \cdot T_x \qquad (13\text{-}1).$$

Hereupon, since $$T_x = 2\pi/\omega_x,$$

then substituting Eq. (12-1) together with the above relation into Eq. (13-1), the following equation is given:

$$Ec = \qquad (13\text{-}2)$$
$$K_8 \cdot K_9 \cdot K_{10} \cdot K_{12} \frac{2\pi}{\omega_x} \cdot R_f \cdot |E_I| \cdot \sqrt{1 + (\omega_x \cdot R \cdot C)^2} \cdot \frac{1}{R}.$$

Here letting $$K_8 \cdot K_9 \cdot K_{10} \cdot K_{12} = \kappa_c,$$

then Eq. (13-2) is rewritten as $$Ec = \kappa_c \cdot \frac{2\pi}{\omega_x} \cdot R_f \cdot |E_I| \cdot \sqrt{1 + (\omega_x \cdot R \cdot C)^2} \cdot \frac{1}{R}. \qquad (13\text{-}2')$$

Modifying the right hand side of Eq. (13-2)' as $$Ec = 2\pi \cdot \kappa_c \cdot R_f \cdot |E_I| \cdot \frac{\sqrt{1 + (\omega_x \cdot R \cdot C)^2}}{\omega_x \cdot R \cdot C} \cdot C$$

and using the following relation $$\frac{\sqrt{1 + (\omega_x \cdot R \cdot C)^2}}{\omega_x \cdot R \cdot C} = \operatorname{cosec} \theta,$$

which is obtained from Eq. (2), then Ec is expressed as $$Ec = 2\pi \cdot \kappa_c \cdot R_f |E_I| \cdot \operatorname{cosec} \theta \cdot C.$$

Therefore, similarly as in the case of the conductance part described previously, making $\Delta\theta \to 0$ and taking the steady-state offset to be zero, Ec is finally expressed as $$Ec = 2\pi \cdot \kappa_c \cdot R_f E_I | \cdot \operatorname{cosec} \theta_o \cdot C \qquad (13\text{-}3)$$

Here, since the right hand side of Eq. (13-3) does not include any term of 1/R, it is clear that Ec is independent of the conductance and is proportional only to the capacitance C.

Figure 2B:
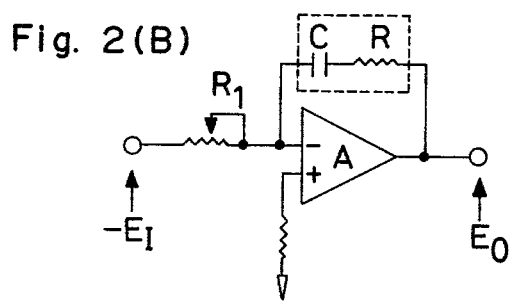

(6) Other configuration of the measuring unit circuit:

In the above, the explanation was given to the case where the object to be measured is expressed as an equivalent circuit of the parallel connection of R and C as shown in FIG. 2A. There exist still other sorts of object to be measured which are expressible with different equivalent circuits from that of already explained case. Corresponding to those different sorts of the object to be measured, the circuit construction of the measuring unit circuit is also different as shown by FIGS. 2B to 2D and classified as follows:

(i) The case of an equivalent circuit of a series connection of a capacitance C and a resistance R (the case shown by a part of dotted line box in FIG. 2B).

Figure 2C:
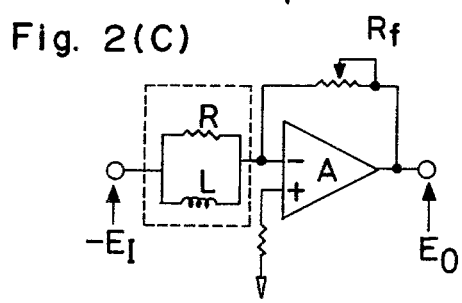

(ii) The case of an equivalent circuit of a parallel connection of an inductance L and a resistance R (FIG. 2C).

Figure 2D:
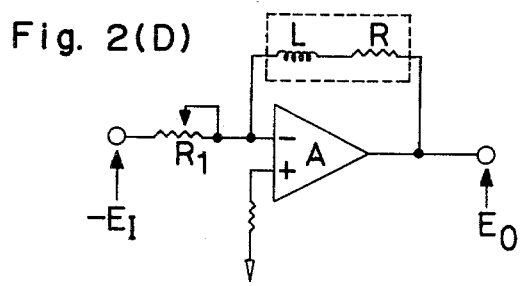

(iii) The case of an equivalent circuit of a series connection of an inductance L and a resistance R (FIG. 2D).

The explanation is given to those cases mentioned above. For those cases, the relation between the frequency transfer function $K_4$ and the phase angle $\theta$ of the measuring unit circuit is shown in the following table, together with the relation of cases (0), which has been described above, for comparison.

| | $K_4$ | $\theta$ | corresponding circuits shown in FIG. |
|---|---|---|---|
| 0 | $\left(\frac{1}{R} + j\omega_x \cdot C\right) \cdot R_f$ | $\tan^{-1} \omega_x C \cdot R$ | 2A |
| i | $\left(R - 40j \frac{1}{\omega_x \cdot C}\right) \cdot R_f$ | $-\tan^{-1}\left(\frac{1}{\omega_x \cdot C \cdot R}\right)$ | 2B |
| ii | $\left(\frac{1}{R} - j \frac{R}{\omega_x \cdot L}\right) \cdot R_f$ | $-\tan^{-1}\left(\frac{1}{\omega_x \cdot L}\right)$ | 2C |
| iii | $(R + j\omega_x \cdot L) \cdot \frac{1}{R}$ | $\tan^{-1}\left(\frac{\omega_x \cdot L}{R}\right)$ | 2D |

In this table, by comparing the dependencies of $K_4$ and $\theta$ with respect to $\omega_x$ for those cases of (i), (ii), and (iii) with that for the case of (0), it will be understood that if the voltage-to-frequency converter $G_9$ in FIG. 1 for the case (0) is replaced by a voltage-to-period converter for the cases (i) and (ii), almost the same treatment as for the case (0) can also be applied to the cases (i) and (ii). For the case (iii), the substitution of $G_9$ mentioned above above is not necessary.

Hereupon Eo is proportional to R for the cases (i) and (iii), while it is proportional to 1/R for the cases (0) and (ii). Therefore, depending upon the object to be measured, either one should be selected.

Besides the above-mentioned modified circuit examples, still different circuits, for example, a circuit wherein a parallel connection of R and C is placed in the feedback path of an amplifier may be considered. In this case the transfer function and the phase angle are given respectively as $1/(R_1(1/R + j\omega_x \cdot C))$ and $-\tan^{-1} \omega_x \cdot C \cdot R$, then the signal processing thereafter is the same as for the case (i).

Operation of the abovementioned example:

First, the rerrerence voltage sources $V_{R1}$ and $V_{R2}$ are set in such values to select the phase difference $\theta$ of the input and output signals of the measuring unit circuit $G_4$ to be a specified set value $\theta_o$ other than 0°.

Then the frequency $\omega_x/2\pi$ of the voltage-controlled oscillator $G_2$ is automatically adjusted by the action of the constant-voltage control loop so as to make the phase difference the abovementioned set value $\theta_o$. After this setting of $\theta_o$, the operation is automatically processed in accordance with the operation principle described above, and the D-A converter $G_{12}$ issues the value indicating the capacitance C. Also be setting the zero point by adjusting the variable resistor $V_{R17}$, the value $E'_{1/R}$ indicating the reciprocal of the resistance R is given from the differential amplifier $G_{13}$.

Figure 7:
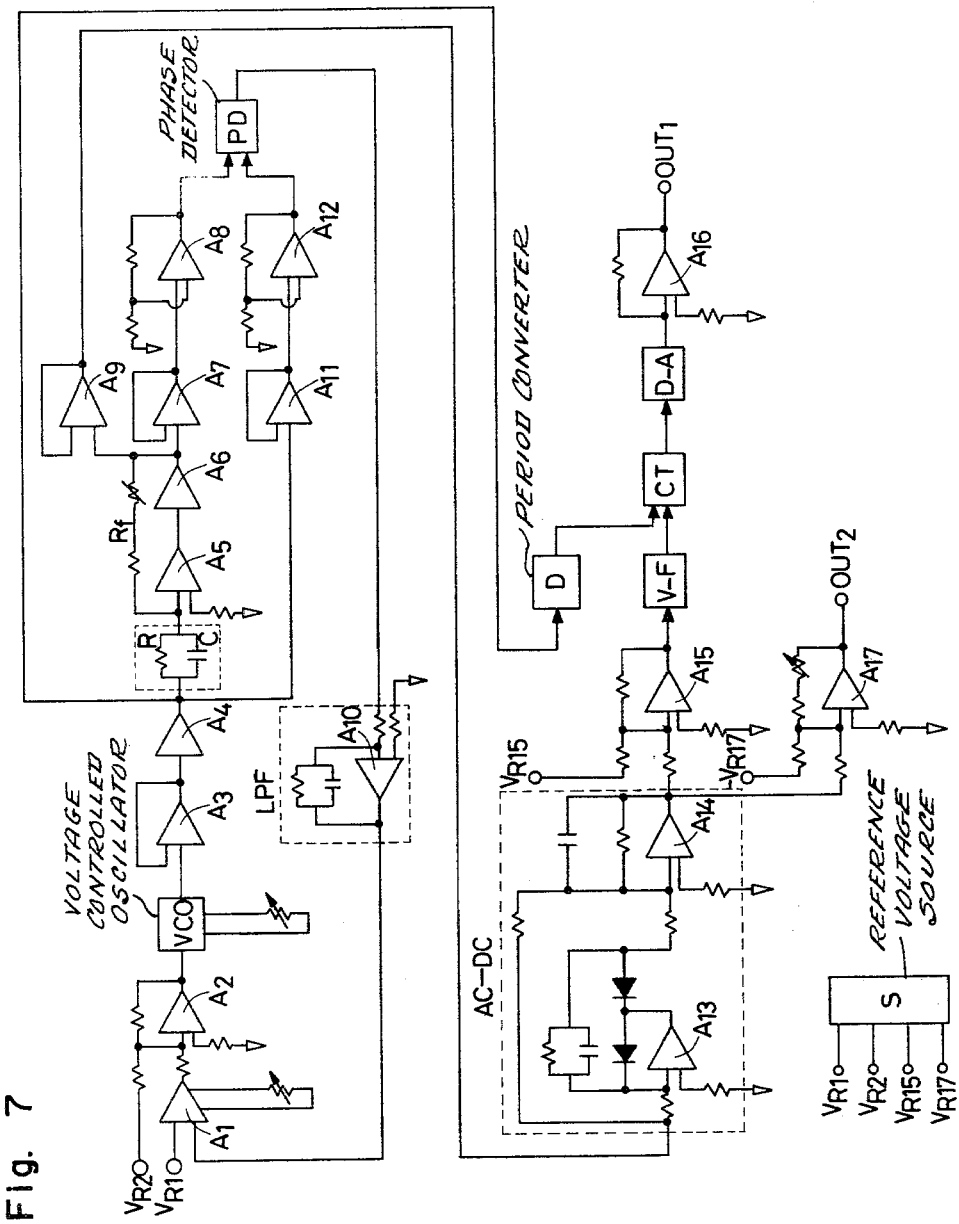
FIG. 7 is a circuit diagram of a practical embodiment of the present invention.

FIG. 7 shows an example of more specifically represented circuit for the apparatus of FIG. 1, wherein $A_1$ corresponds to $SP_1$ and $G_1$; $A_2$ to $SP_2$; VCO to $G_2$; $A_4$ to $G_3$; R,C,$A_5$ and $A_6$, to $G_4$, $A_8$ to $G_6$, PD and a circuit LPF including $A_{10}$ surrounded by the dotted line box to $G_7$, a circuit AC-DC including, $A_{13}$ and $A_{14}$ inside the other dotted line box to $G_8$; $A_{11}$ and $A_{12}$ to $G_5$; D to $G_{10}$; $A_{15}$ and V-F to $G_9$; CT to $G_{11}$; D-A and $A_{16}$ to $G_{12}$; and then $A_{17}$ corresponds to $SP_3$ and $G_{13}$, respectively. $A_3$, $A_7$, $A_9$ and $A_{11}$ are buffer amplifiers. From a terminal $OUT_1$ the capacitance part signal is issued, while from a terminal $OUT_2$ the conductance part signal is issued. Also a reference voltage source S for supplying the voltages $V_{R1}$, $V_{R2}$, $V_{R15}$ and $V_{R17}$ is provided. The voltage $V_{R15}$ is a bias for $A_{15}$.

A simulation experiment by using an apparatus of the circuit of FIG. 7 which was constructed with those parts shown in the following parts list was made and the function of the present invention has been confirmed.

| Parts List | | |
|---|---|---|
| Symbol | Type | Maker |
| $A_1$ | AD520J | Analog Devices |
| $A_2,A_{15},A_{16},A_{17}$ | LM725 | National Semiconducter Corp. |
| VCO, V-F | 8038CC | Intersil Inc. |
| $A_3,A_7,A_9,A_{11}$ | LM310 | National Semiconductors Corp. |
| $A_4,A_6$ | LH0002 | National Semiconductors Corp. |
| $A_5$ | AM405 | Datel Systems Inc. |
| $A_8,A_{12}$ | μA734 | Fairchild Semiconductors |
| PD | MC4044 | Motrola Semiconductors |
| $A_{10},A_{13},A_{14}$ | LM301A | National Semiconductor Products Inc. |
| D | MC14522,MC14051 MC14518 and Digital switch MC14510 | Motrola Semiconductor Products Inc. |
| CT | MC14508 | Motrola Semiconductor Products Inc. |
| D-A | AD563J/BCD | Analog Devices |

What we claim is:

1. A method for discriminatively determining electrical characteristics of an object, said characteristics including a resistive part, a capacitive part, and an inductive part, and said object being within a detection cell of a measuring unit circuit, comprising the steps of:
    maintaining a constant phase difference between the phase of an input signal to said measuring unit circuit and the phase of an output signal of said measuring unit circuit corresponding to the phase angle in a frequency transfer function of said measuring unit circuit;
    determining a value corresponding to said resistive part in accordance with an amplitude quantity corresponding to the amplitude of the output of said measuring unit circuit, said amplitude quantity being proportional to the resistance of said object;
    determining a value independent of said resistive part corresponding to one of other possible characteristics of said measuring unit circuit, said other possible characteristics being said capacitive part and said inductive part, in accordance with said amplitude quantity and a frequency quantity corresponding to the frequency of any one of the input and output signals of said measuring unit circuit, the respective frequencies of the input signal to said measuring unit circuit and the output signal of said measuring unit circuit being equal.

2. A method as in claim 1, wherein said frequency transfer function of said measuring unit circuit is a ratio ($K_4$) of two voltages.

3. A method as in claim 1, wherein the input signal to said measuring unit circuit is obtained from a voltage-controlled oscillator having an oscillation frequency corresponding to a voltage derived from a phase difference between the input and output signals of said measuring unit circuit.

4. A method as in claim 1, wherein the value corresponding to said resistive part of said object contained in said measuring unit circuit is determined by measuring a DC voltage obtained by rectifying the output signal from said measuring unit circuit.

5. A method as in claim 1, wherein the value corresponding to said resistive part of an object contained in said measuring unit circuit is determined by:
    generating pulses having a frequency determined in accordance with a DC signal voltage obtained by the rectification of the output signal of said measuring unit circuit, and
    subsequently measuring the frequency of said pulses.

6. A method as in claim 1, wherein the value of one of other possible parts of said object, said other possible parts being a capacitive part and an inductive part is determined by:
    generating pulses having a frequency determined in accordance with a DC signal voltage obtained by the rectification of the output signal of said measuring unit circuit, and
    then counting said pulses in an open-gate time interval controlled by a signal responding to a frequency of the output signal of said measuring unit circuit.

7. A method as in claim 1, wherein the value of one of other possible parts of said objects, said other possible parts being a capacitive part and an inductive part is determined by:
    generating pulses having a frequency determined in accordance with a DC signal voltage obtained by the rectification of the output signal of said measuring unit circuit, and
    then counting said pulses in an open-gate time interval controlled by a signal responding to a frequency of the input signal to said measuring unit circuit.

8. A method as in claim 6 or 7 further comprising the step of converting the resultant pulse count into an analogue quantity.

9. An apparatus for discriminatively determining electrical characteristics of an object, said characteristics including a resistive part, a capacitive part, and an inductive part, comprising:
    a constant value control loop for maintaining a phase angle in a frequency transfer function at a predetermined value, said constant value control loop comprising:
    a measuring unit circuit having said frequency transfer function for application to an input signal thereof to obtain an output signal thereof, said object being within a detection cell of said measuring unit circuit;

detector means for detecting a phase difference between the output signal of said measuring unit circuit and the input signal to said measuring unit circuit and for obtaining a phase difference signal in accordance with said phase difference; and a voltage controlled oscillator for obtaining an output signal having a frequency determined in accordance with said phase difference signal, the signal obtained by said voltage controlled oscillator being supplied to said measuring unit circuit as the input signal thereof;

and a signal processing circuit for selectively obtaining signals corresponding to the respective values of said electrical characteristics, comprising:

a pulse generator for obtaining a pulse signal having a frequency corresponding to the amplitude of the output signal of said measuring unit circuit, the amplitude of the output signal of said measuring unit circuit being proportional to said resistive part, and counter means for counting said pulse signal in gate open time determined in accordance with any one of said input and output signals of said measuring unit circuit and the output signal of said voltage controlled oscillator, the respective frequencies thereof being equal, a signal indicative of one of said capacitive part and said inductive part thereby being obtained.

10. An apparatus as in claim 7, wherein said measuring unit circuit includes a current amplifier therein.

11. An apparatus as in claim 9, wherein said frequency transfer function is a ratio of two voltages, and wherein the phase angle in said transfer function is maintained constant by adjusting the frequency of the input signal to said measuring unit circuit.

12. An apparatus as in claim 9, wherein said detector means comprises a pair of waveform converters respectively connected across said measuring unit circuit to respectively receive the input signal to and the output signal of said measuring unit circuit for converting the input signal to and the output signal of said measuring unit circuit to respective square wave signals, said phase difference signal being obtained in accordance with said respective square wave signals.

13. An apparatus as in claim 9, wherein said constant value control loop further comprises an amplifier having one input connected to an output of said detector means to receive said phase difference signal and another input connected to a reference voltage source, for issuing an input signal to said voltage-controlled oscillator.

14. An apparatus as in claim 9, wherein said constant value control loop further comprises a current amplifier connected between an output of said voltage controlled oscillator and an input of said measuring unit circuit.

15. An apparatus as in claim 9, wherein said pulse generator comprises a voltage-to-frequency converter having an output frequency controlled by a rectified output of said measuring unit circuit.

16. An apparatus as in claim 9, wherein said pulse generator comprises:

means for rectifying the output signal of said measuring unit circuit, and means for differentially amplifying the output of said rectifying means after the rectification, thereby to detect the value of the resistive part of an object contained in said measuring unit circuit.

17. An apparatus as in claim 9, wherein said pulse generator comprises a voltage-to-frequency converter, and wherein said counter means comprises means to detect a frequency of an output of said converter, thereby to detect the value of a reactive part of an object contained in said measuring unit circuit.

18. An apparatus as in claim 9, wherein said counter means comprises: a counter having one input connected to said pulse generator, and a counter converter connected between an input terminal of said measuring unit circuit for receiving the input signal thereto, and another input of said counter for controlling the counting action of said counter for counting the output pulses of said pulse generator.

19. An apparatus as in claim 9 further comprising a digital-to-analogue converter connected to an output of said counter means for deriving an analogue quantity from a resultant pulse count output of said counter means.

20. A method as in claim 1, wherein said maintaining step is performed by a constant-value control loop and comprises the steps of:

detecting a phase different between the input and output signal of said measuring unit circuit;

generating a phase difference signal in accordance with a detected phase difference resulting from said detecting step; and varying a frequency of the input signal to said measuring unit circuit in accordance with a voltage derived from said phase difference signal.

* * * * *